United States Patent [19]

Oka et al.

[11] 4,160,236

[45] Jul. 3, 1979

[54] FEEDBACK SHIFT REGISTER

[75] Inventors: Takafumi Oka, Odawara; Hiroshi Nakanishi, Sayama, both of Japan

[73] Assignees: Hitachi, Ltd.; Nippon Telegraph and Telephone Public Corporation, both of Japan

[21] Appl. No.: 831,140

[22] Filed: Sep. 7, 1977

[30] Foreign Application Priority Data

Sep. 10, 1976 [JP] Japan .................................. 51-107755

[51] Int. Cl.$^2$ .............................................. G06F 11/12
[52] U.S. Cl. ........................... 340/146.1 AL; 235/312
[58] Field of Search ............................. 235/312, 303.2; 340/146.1 AL

[56] References Cited

U.S. PATENT DOCUMENTS

| | | | |
|---|---|---|---|
| 3,678,469 | 7/1972 | Freeman et al. | 340/146.1 AL |
| 3,703,705 | 11/1972 | Patel | 340/146.1 AL |
| 3,859,630 | 1/1975 | Bennett | 340/146.1 AL |
| 3,893,078 | 7/1975 | Finet | 340/146.1 AL |

OTHER PUBLICATIONS

Duvochel and Favre, Block Check Character Determination in Table-Look-Up Procedure, IBM Tech. Disclosure Bulletin, vol. 18, No. 10, Mar. 1976, pp. 3320-3321.
Clough et al., Semi-Parallel Generation of CRC Character, IBM Technical Disclosure Bulletin, vol. 19, No. 9, Feb. 1977, pp. 3555-3556.

*Primary Examiner*—Charles E. Atkinson
*Attorney, Agent, or Firm*—Craig and Antonelli

[57] ABSTRACT

A feedback shift register for use in a system processing a data signal received from a memory such as a magnetic disc or magnetic drum or from, for example, a communication line so as to detect and correct any error which may present in the data signal. The feedback shift register comprises means for producing address information by making a first logical operation on the input data and the internal state of the shift register, a memory providing data determined by a second logical operation among the bits of the address information upon reception of the address information from the above means, and means for renewing the internal state of the shift register upon reception of the data from the memory. A peculiar polynomial suited to the characteristic of an associated memory, communication line or the like is based on the first and second logical operations, and the shift register can process a high-speed data signal in spite of its simple construction.

8 Claims, 6 Drawing Figures

FEEDBACK SHIFT REGISTER

LIST OF PRIOR ART REFERENCE

The following reference is cited to show the state of the art:

W. Weslay Peterson and E. J. Weldon, Jr. "Error-Correcting Codes" second edition, published by the MIT Press, pp. 365-372.

FIELD OF THE INVENTION

This invention relates to a data error detecting and correcting device for use in a system processing data received from a memory such as a magnetic drum or magnetic disc or from, for example, a communication line. In particular, this invention relates to a feedback shift register which is constructed according to a peculiar polynomial suited to the characteristic of an associated memory or communication line and can generate data error check bits and a data error correcting pattern.

DESCRIPTION OF THE PRIOR ART

Figure 1:
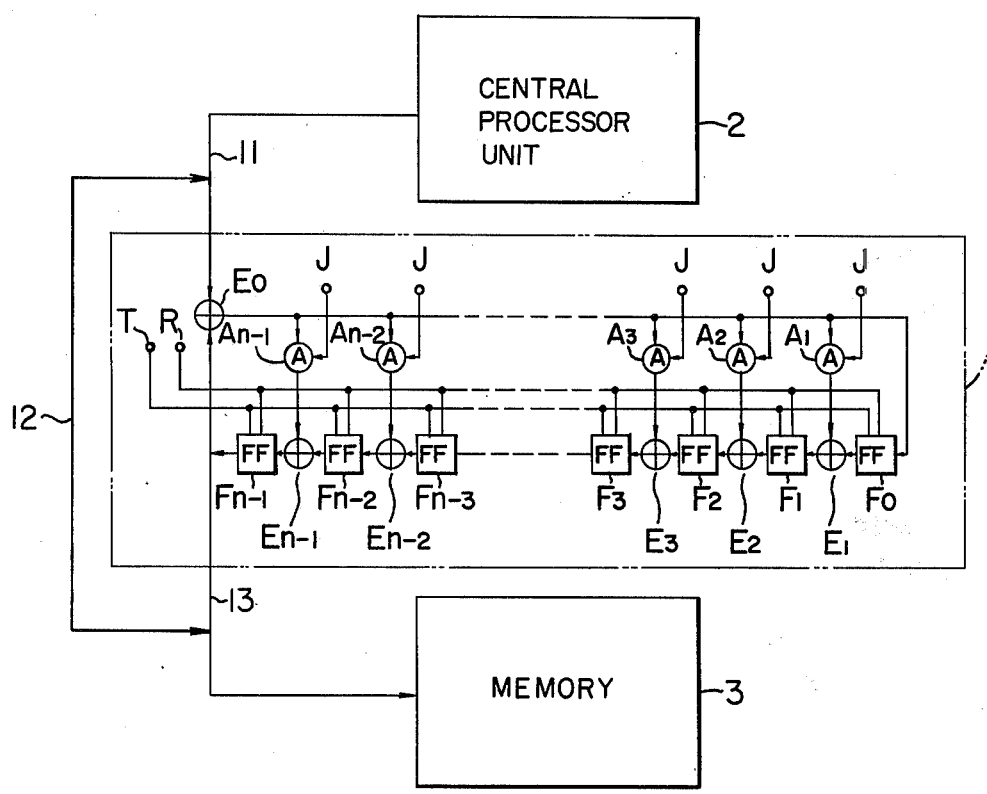
FIG. 1 is a basic circuit diagram of a prior art feedback shift register to illustrate the construction of the shift register and its check bit generating operation.

It is commonly known that a check bit of redundant length is added to the end of each data block and is recorded together with the data block during writing of the data in a memory, so that this check bit can be used for error detection and correction of the recorded data during reading out of the data from the memory. FIG. 1 shows a basic circuit of a feedback shift register 1 which has been used hitherto for the purpose of data error detection and correction. The blocks 2 and 3 designate a central processor unit (CPU) of a computer system, and a memory such as a magnetic disc or magnetic drum memory, respectively. A plurality of flip-flops $F_0$ to $F_{n-1}$ constitute the feedback shift register 1. A setting trigger signal and a reset signal for these flip-flops $F_0$ to $F_{n-1}$ are applied to input terminals T and R respectively. Exclusive-OR gates $E_0$ to $E_{n-1}$ are connected to the inputs of these flip-flops $F_0$ to $F_{n-1}$ respectively, and AND gates $A_1$ to $A_{n-1}$ are connected to the inputs of these Exclusive-OR gates $E_1$ to $E_{n-1}$ respectively. The gates $A_1$ to $A_{n-1}$ are opened when an actuating signal is applied to terminals J connected therewith. An input data and the output of the flip-flop $F_{n-1}$ in the last stage are applied to the Exclusive OR-gate $E_0$, and the output of this gate $E_0$ is applied to the flip-flop $F_0$ in the first stage. The data obtained by the Exclusive-OR operation on the outputs of the flip-flops $F_0$ to $F_{n-2}$ and the outputs of the AND gates $A_1$ to $A_{n-1}$ are applied to the flip-flops $F_1$ to $F_{n-1}$ respectively.

Suppose that a polynomial $G(X) = X^n + g^{n-1}X^{n-1} + \ldots + g^1 X + 1$ is employed in the feedback shift register having such a construction. In such a case, coefficients of $g^1$ to $g^{n-1}$ are equal to 1 when the associated AND gates $A_1$ to $A_{n-1}$ are opened, while the coefficients of $g^1$ to $g^{n-1}$ are equal to 0 when the associated AND gates $A_1$ to $A_{n-1}$ are closed. Thus, the feedback shift register can operate according to any desired polynomial when suitable ones of the AND gates $A_1$ to $A_{n-1}$ are selectively opened.

Figure 2:
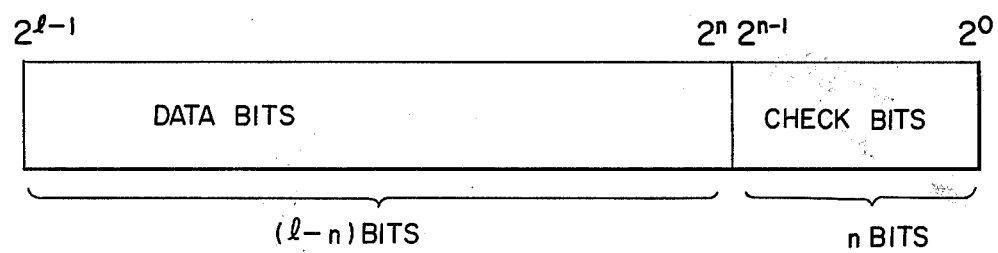
FIG. 2 shows a data format employed for error detection and correction.

The feedback shift register produces a check bit in a manner as described presently. In this description, it is supposed that the data format is as shown in FIG. 2. At first, a reset signal is applied to the reset signal input terminal R to reset all the flip-flops $F_0$ to $F_{n-1}$. Thereafter, the data bits transmitted from the central processor unit 2 are applied to the feedback shift register 1 through a path 11 in sequential order from the first bit $2^{l-1}$ and are simultaneously supplied to the memory 3 through a path 12 and then recorded on the recording medium of the memory 3. The Exclusive-OR gate $E_0$ carries out is Exclusive-OR operation on the data bit $2^{l-1}$ and the output of the flip-flop $F_{n-1}$ in the last stage, and the resultant output of the Exclusive-OR gate $E_0$ is applied to the flip-flop $F_0$ in the first stage. At the same time, the output of the Exclusive-OR gate $E_0$ passes through the opened ones of the AND gates $A_1$ to $A_{n-1}$ to be applied to the corresponding ones of the Exclusive-OR gates $E_1$ to $E_{n-1}$. These Exclusive-OR gates carry out their Exclusive-OR operation on the output of the Exclusive-OR gate $E_0$ and the outputs of the flip-flops in the preceding stages, and their outputs are applied to the associated flip-flops. This operation is repeated so that the contents of the register 1 at the time of application of the last data bit $2^n$ correspond to the check bits of n bits, $2^{n-1}$ to $2^0$. These check bits are transmitted to the memory 3 through a path 13 and then recorded on the recording medium of the memory 3 after the last data bit $2^n$ in the form shown in FIG. 2.

Error detection is carried out in a manner as described presently. In response to the application of a reset signal to the reset signal input terminal R of the feedback shift register 1, all the flip-flops $F_0$ to $F_{n-1}$ are reset. Then, the data bits read out from the recording medium of the memory 3 are applied sequentially to the shift register 1 through the paths 12 and 11. In this case, the first bit $2^{l-1}$ of the data bits provides the first input to the shift register 1, and the shift is ceased at the time at which the last bit $2^0$ of the check bits is applied. The contents of the shift register at this time are checked, and the data thus read out or transferred are proved error-free when the contents of all the flip-flops are in the "0" state. However, an error exists when the content of at least one of the flip-flops is a 1. In such a case, the shift register 1 is shifted without application of any input thereto until the contents of a specific series of the flip-flops $F_0$ to $F_{n-1}$ attain "0". At that time, the contents of the remaining flip-flops provide the error bit pattern used for the error correction.

Figure 3:
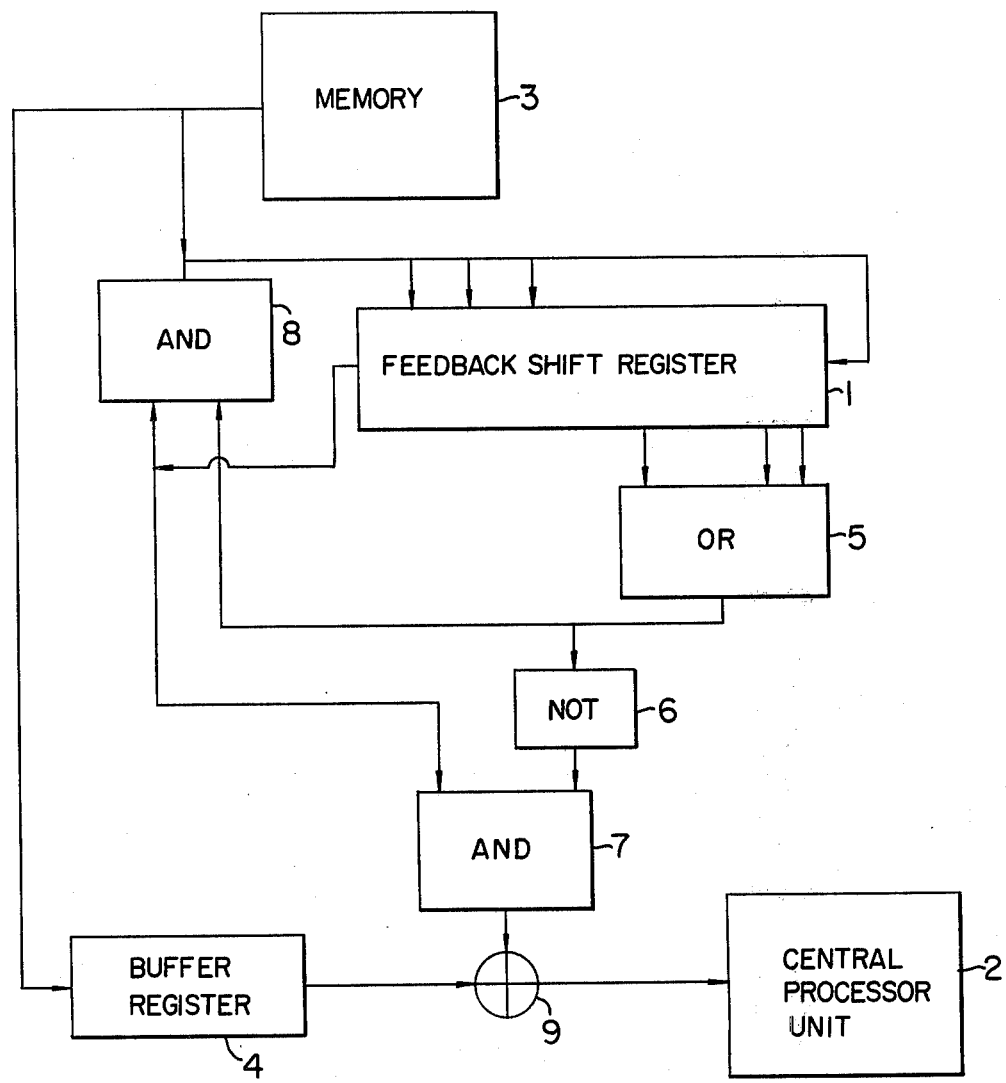
FIG. 3 is a block diagram illustrating the operation of a prior art data error correcting circuit using a feedback shift register as shown in FIG. 1.

The error correcting operation will be described with reference to FIG. 3. Referring to FIG. 3, reference numeral 4 designates a buffer register for sequentially storing the data bits of the first bits $2^{l-1}$ to the last bit $2^n$ when the data bits are read out of the memory 3. When the contents of the feedback shift register 1 indicate that an error exists in the read-out data, the shift register 1 is shifted until all the inputs to an OR circuit 5 are "0". An error exists in the data bit output of a buffer register 4 appearing at the time at which all the inputs to the OR circuit 5 are "0" and simultaneously the feedback shift register provides a "1" to AND gate 7. This erroneous bit is applied to an Exclusive-OR gate 9 which is provided to correct the error by making its Exclusive-OR operation on the erroneous bit input and the output of an AND circuit 7 applied at that time. More precisely, when all the inputs applied to the OR circuit 5 are "0", its output is also "0", and this output is inverted by a NOT circuit 6 to apply a "1" to the input of the AND circuit 7. The logical output of the AND circuit 7 at this time is "1" since the erroneous bit output of the shift register 1 is applied to the other input of the AND circuit 7. Such an output of the AND circuit 7 is applied to one of the inputs of the Exclusive-OR gate 9 to invert the bit output of the buffer register 4 in which data is stored, and the resultant output of the Exclusive-OR gate 9 is applied to the central processor unit 2. In this manner, the data error is corrected. On the other hand, the AND circuit 7 is kept closed so long as the output of the OR gate 5 remains "0". In this case, the output of the buffer register 4 is transferred intact to the central processor unit 4, and at the same time, such a logical output of the OR circuit 5 is fed back to the shift register 1 through an AND circuit 8 to sequentially shift the contents of the shift register 1 toward the left. This operation continues until a logical output "0" appears from the OR circuit 5. Therefore, error correction of the data transferred from the memory 3 to the central processor unit 2 is completed at the time at which the contents of all the flip-flops of the shift register 1 provide "0".

The primary factor which determines the maximum code length of the code consisting of the data bits and the check bits is the polynomial which is peculiar to and selected to suit the characteristic of a memory employed in a specific system. The error detecting ability and error correcting ability are also greatly dependent upon this peculiar polynomial G(X). It is therefore necessary to prepare a feedback shift register which satisfies the polynomial G(X) selected to suit the characteristic of a memory or data transfer means.

In a modern data processing system, data is processed at a very high speed. Thus, it is required to use high-speed circuit elements resulting in an increase in the system cost when data is applied one bit at a time as in the prior art feedback shift register. A method has been proposed in which a plurality of data bits are simultaneously applied to a feedback shift register. While this proposed method is advantageous in that employment of circuit elements operating at an excessively high speed can be dispensed with, it has such disadvantages that the circuitry is very complex, and many circuit elements are required resulting also in an increase in the system cost. Such prior art defect will be described with reference to FIGS. 4 and 5.

Figure 4:
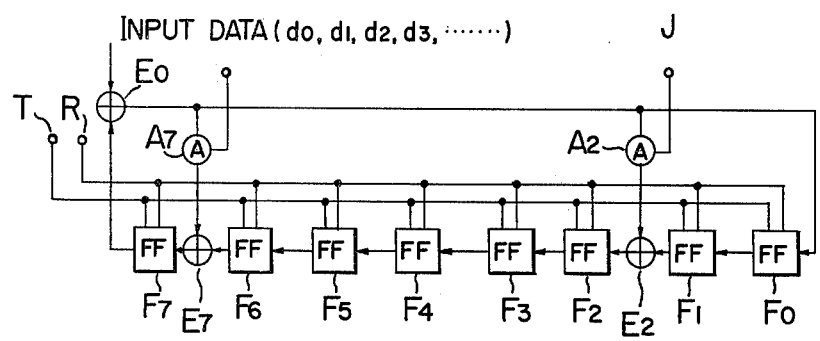
FIGS. 4 and 5 are circuit diagrams to illustrate how the prior art feedback shift register has been defective.

FIG. 4 illustrates a feedback shift register adapted to operate with a polynomial $G(X) = X^8 + X^7 + X^2 + 1$. In FIG. 4 like reference characters are used to designate like parts appearing in FIG. 1. It is supposed herein that n=8, and data is applied one bit after another to the feedback shift register.

Referring to FIG. 4, the contents of flip-flops $F_0$ to $F_7$ are initially $a_0$ to $a_7$ respectively, and a data input of four bits is applied in sequential order of $d_0$, $d_1$, $d_2$ and $d_3$. The contents of the register are shown in Table 1 in which the symbol $\oplus$ designates Exclusive-OR operation.

Table 1

| | |
|---|---|
| $a_0$ | $C_3 \oplus (C_0 \oplus C_1 \oplus C_2)$ |
| $a_1$ | $C_2 \oplus (C_0 \oplus C_1)$ |
| $a_2$ | $C_1 \oplus (C_1 \oplus C_2 \oplus C_3)$ |
| $a_3$ | $C_0 \oplus (C_0 \oplus C_1 \oplus C_2)$ |
| $a_4$ | $a_0 \oplus (C_0 \oplus C_1)$ |
| $a_5$ | $a_1 \oplus (C_0)$ |
| $a_6$ | $a_2$ |
| $a_7$ | $a_3 \oplus (C_0 \oplus C_1 \oplus C_2 \oplus C_3)$ |

In this Table, $C_0 = a_7 \oplus d_0$, $C_1 = a_6 \oplus d_1$, $C_2 = a_5 \oplus d_2$, and $C_3 = A_4 \oplus d_3$.

Figure 5:
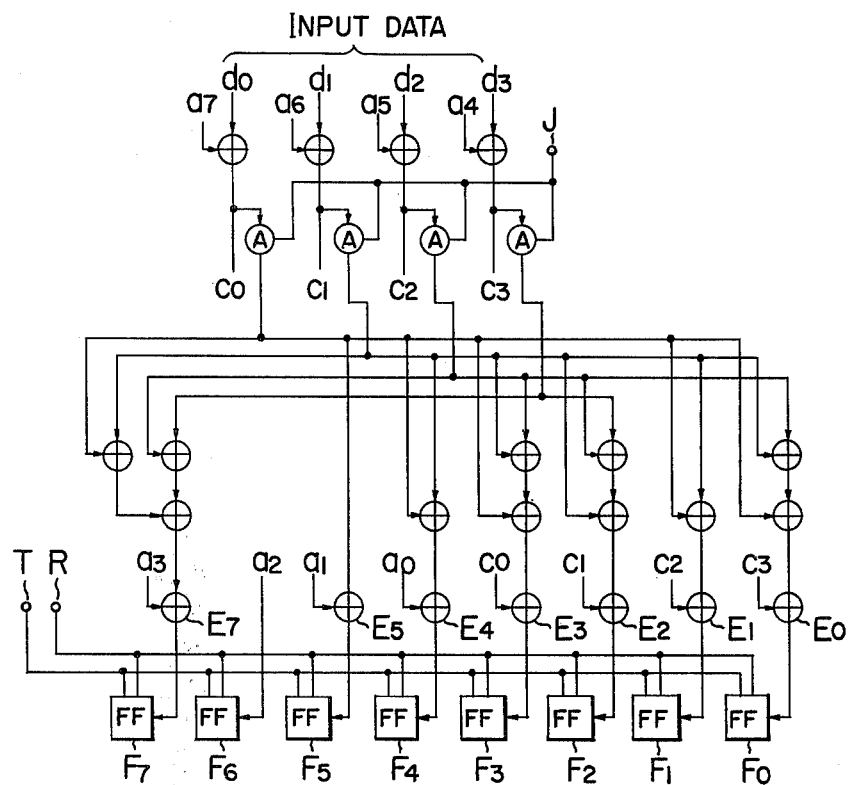

Therefore, a feedback shift register will have a construction as shown in FIG. 5 when four data bits are simultaneously applied, and the same polynomial G(X) as that of the feedback shift register shown in FIG. 4 is used. In FIG. 5, like reference characters are used to designate like parts appearing in FIG. 1. As in FIG. 1, A designates AND gates opened in response to application of an actuating signal to a terminal J, and $\oplus$ designates Exclusive-OR gates. It will be readily seen from comparison between FIG. 4 and FIG. 5 that the circuitry becomes very complex, and the number of circuit elements increases excessively when a plurality of data bits are simultaneously applied although the polynomial G(X) is the same.

In a data processing system, a single feedback shift register may be incorporated in a control unit which controls a plurality of magnetic memories of different characteristics such as magnetic discs and magnetic drums. It may be desired in such a system to provide a plurality of polynomials G(X) suited individually to the characteristics of the magnetic memories by merely changing over the feedback mode of the feedback shift register depending on the individual magnetic memories.

SUMMARY OF THE INVENTION

It is therefore a first object of the present invention to realize a high-speed feedback shift register with simple circuit arrangement.

A second object of the present invention is to provide a feedback shift register which permits ready change-over of its feedback mode.

In accordance with a first aspect of the present invention, there is provided a feedback shift register comprising register means including a bistable memory element in each of a plurality of stages, means for producing address information by making a first predetermined logical operation on the input data and the internal state of said register means, memory means for providing data determined by a second predetermined logical operation among the bits of said address information upon reception of said address information from said address information producing means, and means for renewing the iternal state of said register means upon reception of said data from said memory means.

In accordance with a second aspect of the present invention, there is provided a feedback shift register comprising register means including a bistable memory element in each of a plurality of stages, means for producing address information by making a first predetermined logical operation on the input data and the internal state of said register means, memory means for providing data determined by a second predetermined logical operation among the bits of said address information upon reception of said address information from said address information producing means, and means for renewing the internal state of said register means upon reception of said data from said memory means, wherein said address information applied to said memory means is divided into a plurality of groups so as to read out the data by logical operations which differ from each other depending on the groups of address information.

DETAILED DESCRIPTION OF THE PREFERRED EMBODIMENT

Figure 6:
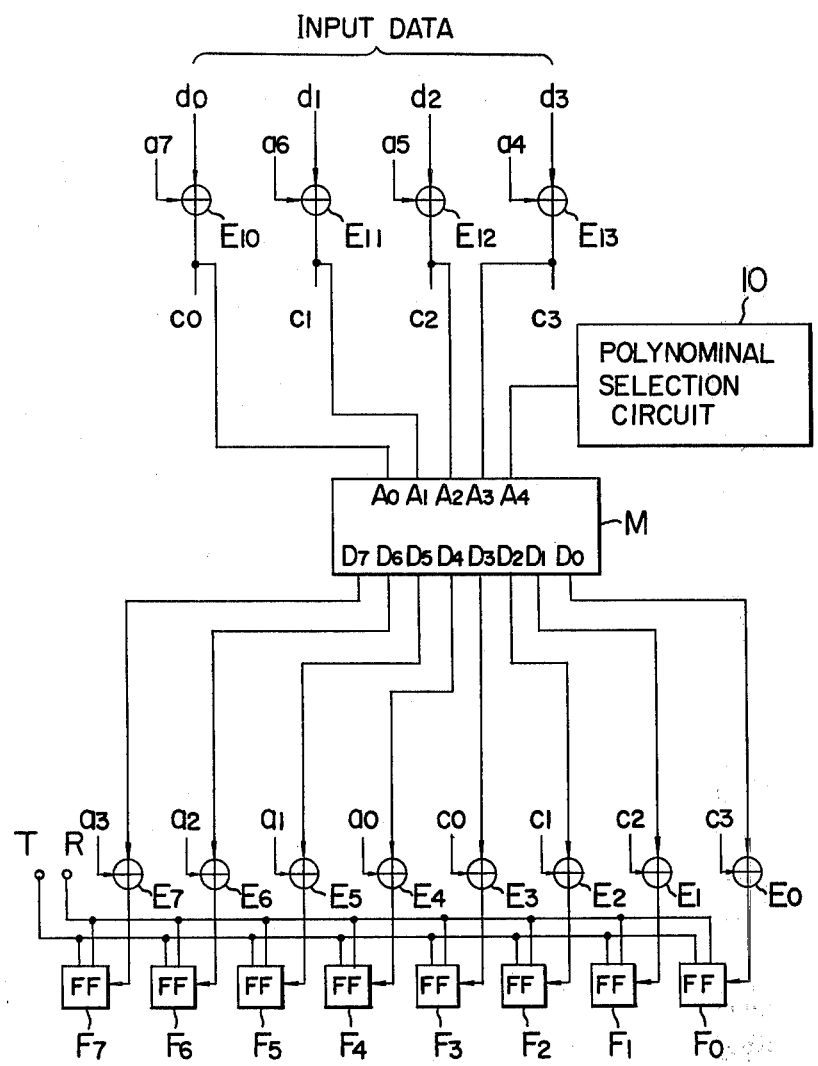
FIG. 6 is a circuit diagram of a preferred embodiment of the feedback shift register according to the present invention.

FIG. 6 illustrates a preferred embodiment of the feedback shift register according to the present invention. The feedback shift register shown in FIG. 6 has the same function as that of the feedback shift register shown in FIG. 5, as described presently. It is apparent that the contents of the register after the application of a 4-bit data are as shown in Table 1. The values $C_0 = a_7 \oplus d_0$, $C_1 \times a_6 \oplus d_1$, $C_2 = a_5 \oplus d_2$, and $C_3 = a_4 \oplus d_3$, and they are produced by Exclusive-OR gates $E_{10}$ to $E_{13}$ respectively. The combinations of $C_0$ to $C_3$ shown in the parentheses in Table 1 are produced by a memory M. This memory M has a capacity of thirty-two words each consisting of eight bits and has five address inputs $A_0$ to $A_4$ and eight data outputs $D_0$ to $D_7$ for sixteen addresses ranging from an address No. 0 to an address No. 15. It is so programmed that, when $C_0$ to $C_3$ are applied to the address inputs $A_0$ to $A_3$ respectively while fixing the input to the address input $A_4$ at "0", the contents according to the following Table 2 appear at the data outputs $D_0$ to $D_7$ of the memory M:

Table 2

| | |
|---|---|
| $D_0$ | $C_0 \oplus C_1 \oplus C_2$ |
| $D_1$ | $C_0 \oplus C_1$ |
| $D_2$ | $C_1 \oplus C_2 \oplus C_3$ |
| $D_3$ | $C_0 \oplus C_1 \oplus C_2$ |
| $D_4$ | $C_0 \oplus C_1$ |
| $D_5$ | $C_0$ |
| $D_6$ | 0 |
| $D_7$ | $C_0 \oplus C_1 \oplus C_2 \oplus C_3$ |

Therefore, the relation between the address inputs and the data outputs of this memory M will be as shown in the upper half of the following Table 3:

Table 3

| Address No. | $A_0$ | $A_1$ | $A_2$ | $A_3$ | $A_4$ | $D_7$ | $D_6$ | $D_5$ | $D_4$ | $D_3$ | $D_2$ | $D_1$ | $D_0$ |
|---|---|---|---|---|---|---|---|---|---|---|---|---|---|
| 0 | 0 | 0 | 0 | 0 | 0 | 0 | 0 | 0 | 0 | 0 | 0 | 0 | 0 |
| 1 | 0 | 0 | 0 | 1 | 0 | 1 | 0 | 0 | 0 | 0 | 1 | 0 | 0 |
| 2 | 0 | 0 | 1 | 0 | 0 | 1 | 0 | 0 | 0 | 1 | 1 | 0 | 1 |
| 3 | 0 | 0 | 1 | 1 | 0 | 0 | 0 | 0 | 0 | 1 | 0 | 0 | 1 |
| 4 | 0 | 1 | 0 | 0 | 0 | 1 | 0 | 0 | 1 | 1 | 1 | 1 | 1 |
| 5 | 0 | 1 | 0 | 1 | 0 | 0 | 0 | 0 | 1 | 1 | 0 | 1 | 1 |
| 6 | 0 | 1 | 1 | 0 | 0 | 0 | 0 | 0 | 1 | 0 | 0 | 1 | 0 |
| 7 | 0 | 1 | 1 | 1 | 0 | 1 | 0 | 0 | 1 | 0 | 1 | 1 | 0 |
| 8 | 1 | 0 | 0 | 0 | 0 | 1 | 0 | 1 | 1 | 1 | 0 | 1 | 1 |
| 9 | 1 | 0 | 0 | 1 | 0 | 0 | 0 | 1 | 1 | 1 | 1 | 1 | 1 |
| 10 | 1 | 0 | 1 | 0 | 0 | 0 | 0 | 1 | 1 | 0 | 1 | 1 | 0 |
| 11 | 1 | 0 | 1 | 1 | 0 | 1 | 0 | 1 | 1 | 0 | 0 | 1 | 0 |
| 12 | 1 | 1 | 0 | 0 | 0 | 0 | 0 | 1 | 0 | 0 | 1 | 0 | 0 |
| 13 | 1 | 1 | 0 | 1 | 0 | 1 | 0 | 1 | 0 | 0 | 0 | 0 | 0 |
| 14 | 1 | 1 | 1 | 0 | 0 | 1 | 0 | 1 | 0 | 1 | 0 | 0 | 1 |
| 15 | 1 | 1 | 1 | 1 | 0 | 0 | 0 | 1 | 0 | 1 | 1 | 0 | 1 |
| 16 | 0 | 0 | 0 | 0 | 1 | 0 | 0 | 0 | 0 | 0 | 0 | 0 | 0 |
| 17 | 0 | 0 | 0 | 1 | 1 | 0 | 0 | 0 | 1 | 0 | 0 | 1 | 0 |
| 18 | 0 | 0 | 1 | 0 | 1 | 0 | 0 | 1 | 0 | 0 | 1 | 0 | 0 |
| 19 | 0 | 0 | 1 | 1 | 1 | 0 | 0 | 1 | 1 | 0 | 1 | 1 | 0 |
| 20 | 0 | 1 | 0 | 0 | 1 | 0 | 1 | 0 | 0 | 1 | 0 | 0 | 0 |
| 21 | 0 | 1 | 0 | 1 | 1 | 0 | 1 | 0 | 1 | 1 | 0 | 1 | 0 |
| 22 | 0 | 1 | 1 | 0 | 1 | 0 | 1 | 1 | 0 | 1 | 1 | 0 | 0 |
| 23 | 0 | 1 | 1 | 1 | 1 | 0 | 1 | 1 | 1 | 1 | 1 | 1 | 0 |
| 24 | 1 | 0 | 0 | 0 | 1 | 1 | 0 | 0 | 1 | 0 | 0 | 0 | 0 |
| 25 | 1 | 0 | 0 | 1 | 1 | 1 | 0 | 0 | 0 | 0 | 0 | 1 | 0 |
| 26 | 1 | 0 | 1 | 0 | 1 | 1 | 0 | 1 | 1 | 0 | 1 | 0 | 0 |
| 27 | 1 | 0 | 1 | 1 | 1 | 1 | 0 | 1 | 0 | 0 | 1 | 1 | 0 |
| 28 | 1 | 1 | 0 | 0 | 1 | 1 | 1 | 0 | 1 | 1 | 0 | 0 | 0 |
| 29 | 1 | 1 | 0 | 1 | 1 | 1 | 1 | 0 | 0 | 1 | 0 | 1 | 0 |
| 30 | 1 | 1 | 1 | 0 | 1 | 1 | 1 | 1 | 1 | 1 | 1 | 0 | 0 |
| 31 | 1 | 1 | 1 | 1 | 1 | 1 | 1 | 1 | 0 | 1 | 1 | 1 | 0 |

Thus, for example, $A_0 = 0$, $A_1 = 0$, $A_2 = 0$, $A_3 = 1$ and $A_4 = 0$ when $c_0 = 0$, $c_1 = 0$, $c_2 = 0$ and $c_3 = 1$. In this case, $D_0$ $(= c_0 \oplus c_1 \oplus c_2) = 0$, $D_1$ $(= c_0 \oplus c_1) = 0$, $D_2$ $(= c_1 \oplus c_2 \oplus c_3) = 1$, $D_3$ $(= c_0 \oplus c_1 \oplus c_2) = 0$, $D_4$ $(= c_0 \oplus c_1) = 0$, $D_5$ $(= c_0) = 0$, $D_6 = 0$, and $D_7$ $(= c_0 \oplus c_1 \oplus c_2 \oplus c_3) = 1$, and such information is read out from the corresponding address or address No. 1 of the memory M. The data outputs $D_0$ to $D_7$ of the memory M are applied to Exclusive-OR gates $E_0$ to $E_7$ respectively. According to Table 1 shown hereinbefore, $c_3$ to $c_0$ and $a_0$ to $a_3$ are applied to the other input of the Exclusive-OR gates $E_0$ to $E_7$ respectively. It is therefore apparent that the feedback shift register having the construction shown in FIG. 6 has the same function as that shown in FIG. 5.

Description will then be directed to changeover of the polynomial G(X) from the aforementioned one to, for example, $G(X) = X^8 + X^4 + X + 1$. In such a case, the contents of the register after the application of the 4-bit data will be as shown in the following Table 4:

Table 4

| | |
|---|---|
| $a_0$ | $c_3$ |
| $a_1$ | $c_2 \oplus c_3$ |
| $a_2$ | $c_1 \oplus c_2$ |
| $a_3$ | $c_0 \oplus c_1$ |
| $a_4$ | $a_0 \oplus c_0 \oplus c_3$ |
| $a_5$ | $a_1 \oplus c_2$ |
| $a_6$ | $a_2 \oplus c_1$ |
| $a_7$ | $a_3 \oplus c_0$ |

In the above table, $c_0 = a_7 \oplus d_0$, $c_1 = a_6 \oplus d_1$, $c_2 = a_5 \oplus d_2$, and $c_3 = a_4 \oplus d_3$.

The address input $A_4$ among the five address inputs $A_0$ to $A_4$ of the memory M is fixed at "1" by the output of a polynomial selection circuit 10 so that, in response to the application of $c_0$ to $c_3$ to the address inputs $A_0$ to $A_3$ respectively, the contents according to Table 5 shown below appear at the data outputs $D_0$ to $D_7$ for sixteen address ranging from an address No. 16 to an address No. 31. Therefore, the relation between the address inputs and the data outputs of this memory M will be as shown in the lower half of Table 3 described hereinbefore. Thus, for example, $A_0 = 0$, $A_1 = 0$, $A_2 = 0$, $A_3 = 1$ and $A_4 = 1$ when $c_0 = 0$, $c_1 = 0$, $c_2 = 0$ and $c_3 = 1$. In this case, $D_0 = 0$, $D_1$ $(= c_3) = 1$, $D_2$ $(= c_2) = 0$, $D_3$ $(= c_1) = 0$, $D_4$ $(= c_0 \oplus c_3) = 1$, $D_5$ $(= c_2) = 0$, $D_6$ $(= c_1) = 0$, and $D_7$ $(= c_0) = 0$, and such information is read out from the corresponding address or address No. 17.

Table 5

| | |
|---|---|
| $D_0$ | 0 |
| $D_1$ | $c_3$ |
| $D_2$ | $c_2$ |
| $D_3$ | $c_1$ |
| $D_4$ | $c_0 \oplus c_3$ |
| $D_5$ | $c_2$ |
| $D_6$ | $c_1$ |

Table 5-continued

| $D_7$ | $c_0$ |
|---|---|

In this manner, the polynomial G(X) can be readily changed over by merely changing the address input $A_4$ of the memory M from a "0" to "1".

It will be understood from the foregoing description of an embodiment of the present invention that the construction of the feedback shift register is not complex compared with that shown in FIG. 5 although its function is the same as that of the latter, and that the register can operate at a high speed since a plurality of data bits can be applied at the same time. Further, the present invention finds very useful practical applications because the polynomial G(X) can be changed over to any desired one by merely providing a simple selection circuit.

We claim:

1. A circuit operating as a feedback shift register receiving selected input data comprising register means including a bistable memory element in each of a plurality of stages, means connected to said register means for producing address information by performing a first predetermined logical operation on the input data and the internal state of said register means, memory means responsive to said address information for providing data stored therein which is determined by a second predetermined logical operation, and means connected to said register means for renewing the internal state of said register means upon reception of the data from said memory means.

2. A circuit operating as a feedback shift register as claimed in claim 1, wherein said first and second logical operations are based on a polynomial.

3. A circuit operating as a feedback shift register as claimed in claim 2, wherein a polynomial selection circuit is further provided, the output of said polynomial selection circuit being connected to at least one address input of said memory means, and said address information applied to said memory means being divided into a plurality of groups so that said second logical operation among the bits of said address information is carried out on the basis of a polynomial selected by said selection circuit for each of said groups of address information.

4. A circuit for generating an error check and correction code for data transferred between devices comprising:

a register for storing an error check and correction code which consists of a plurality of bits;

address generating means responsive to said data and the contents of said register for generating addresses, said addresses being different from each other corresponding to the states of the data received and the contents of said register;

memory means responsive to said addresses for providing information stored in respective addressable locations representing the results of a predetermined logical operation on different selected data to obtain error check and correction codes; and renewing means responsive to an output from said memory means for setting new error check and correction codes into said register.

5. A circuit in accordance with claim 4, wherein said register includes first and second groups of stages and said address generating means includes a first plurality of exclusive-or gates, the number of which equals the number of stages in the first group of said register, each of said exclusive-or gates being connected to receive a bit of said data and a bit from a stage of said first group of said register and providing an output forming a bit of said address.

6. A circuit in accordance with claim 5 wherein said renewing means comprises a second plurality of exclusive-or gates corresponding to the stages of said second group of said register, each of which has two input terminals and an output terminal, each said output terminal being connected to each stage of said second group of said register so as to set therein the result of the exclusive-or operation, said two input terminals of each exclusive-or gate of said second plurality being supplied with a bit of said output from said memory and a bit of a stage of the second group of said register, respectively.

7. A circuit in accordance with claim 4 which further comprises selection means for generating a selection signal, said memory means storing a plurality of groups of information, each of said groups representing results of logical computation based on a different logical operation, said selection signal selecting one of said groups of information.

8. A circuit in accordance with claim 4, wherein said logical computation traces an operation of a conventional feedback shift register constructed to obtain an error check and correction code.

* * * * *